ical Examiner

(12) United States Patent
Doerr et al.

(10) Patent No.: US 7,919,349 B2
(45) Date of Patent: Apr. 5, 2011

(54) PHOTONIC INTEGRATION SCHEME

(75) Inventors: Christopher Richard Doerr, Middletown, NJ (US); Liming Zhang, Marlboro, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 115 days.

(21) Appl. No.: 12/391,039

(22) Filed: Feb. 23, 2009

(65) Prior Publication Data

US 2010/0216275 A1 Aug. 26, 2010

Related U.S. Application Data

(60) Provisional application No. 61/030,875, filed on Feb. 22, 2008.

(51) Int. Cl.
*H01L 21/00* (2006.01)
*H01S 5/00* (2006.01)
(52) U.S. Cl. ............. 438/69; 257/E21.002; 372/46.01
(58) Field of Classification Search .......... 438/69; 398/202; 257/E21.002; 372/46.01
See application file for complete search history.

(56) References Cited

U.S. PATENT DOCUMENTS

| 6,222,865 | B1 * | 4/2001 | Stoltz et al. | 372/46.01 |
| 6,239,422 | B1 * | 5/2001 | Vang et al. | 257/E31.125 |
| 7,164,699 | B1 * | 1/2007 | Braun et al. | 372/29.022 |
| 2009/0074426 | A1 * | 3/2009 | Doerr | 398/202 |
| 2010/0054761 | A1 * | 3/2010 | Chen et al. | 398/212 |

* cited by examiner

*Primary Examiner* — Walter L Lindsay, Jr.
(74) *Attorney, Agent, or Firm* — Hitt Gaines, PC

(57) ABSTRACT

Provided is an apparatus and method for manufacture thereof. The apparatus includes a passive optical waveguide structure and a photodiode detector structure. The structures are located on a substrate, and the photodiode detector is laterally proximate to the semiconductor passive waveguide structure. The passive optical waveguide structure includes a first lateral portion of a semiconductor optical core layer on the substrate, a semiconductor upper optical cladding layer on the optical core layer, and a first lateral portion of a doped semiconductor layer on the upper optical cladding layer. The photodiode detector structure includes a second lateral portion of the semiconductor optical core layer, a semiconductor optical absorber layer on the optical core layer, and a second lateral portion of the doped semiconductor layer.

21 Claims, 11 Drawing Sheets

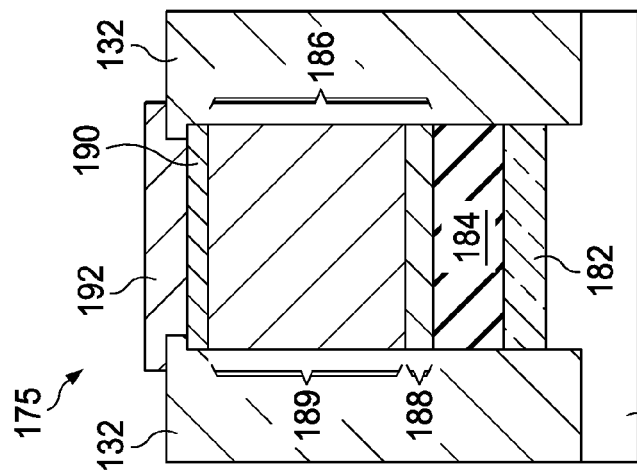
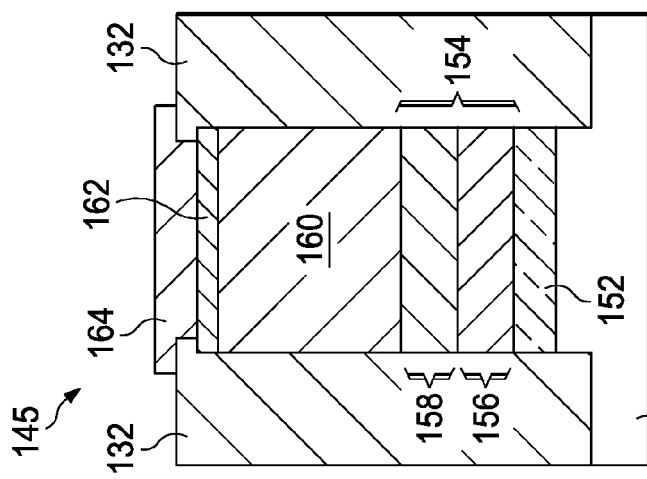
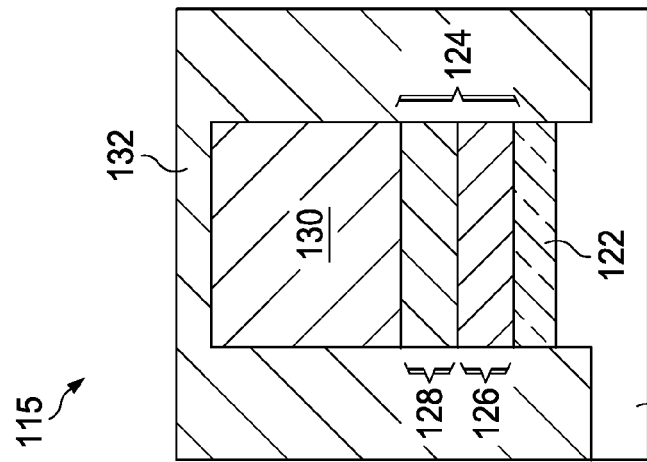

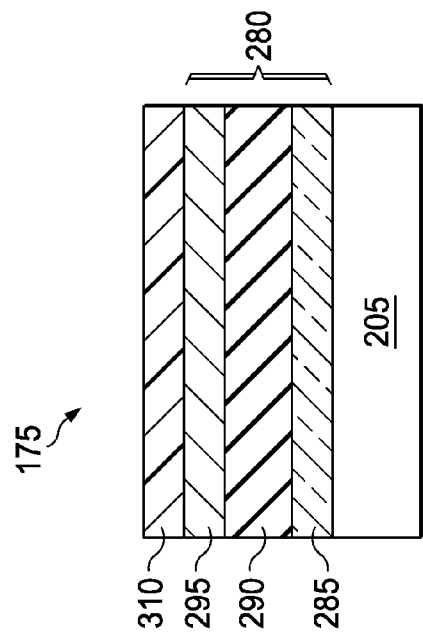
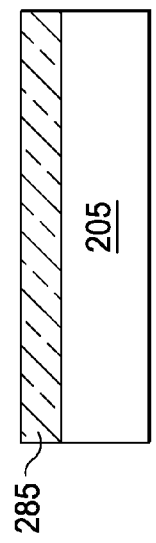
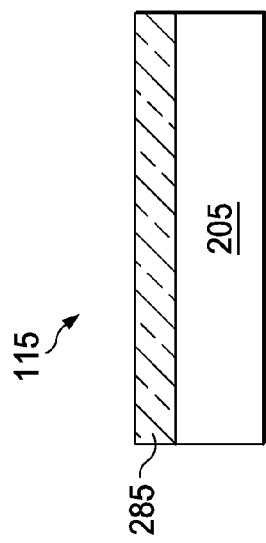
FIG. 3A
FIG. 3B
FIG. 3C

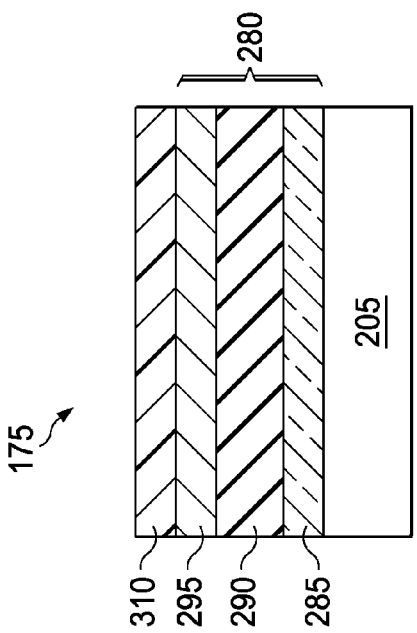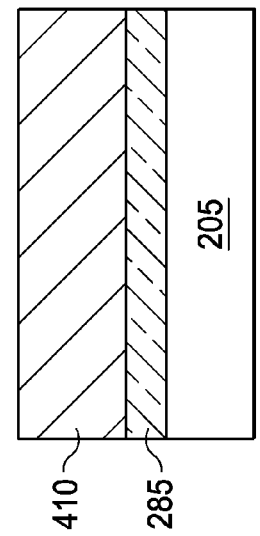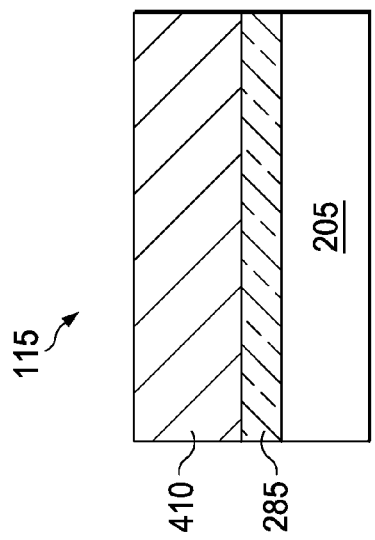

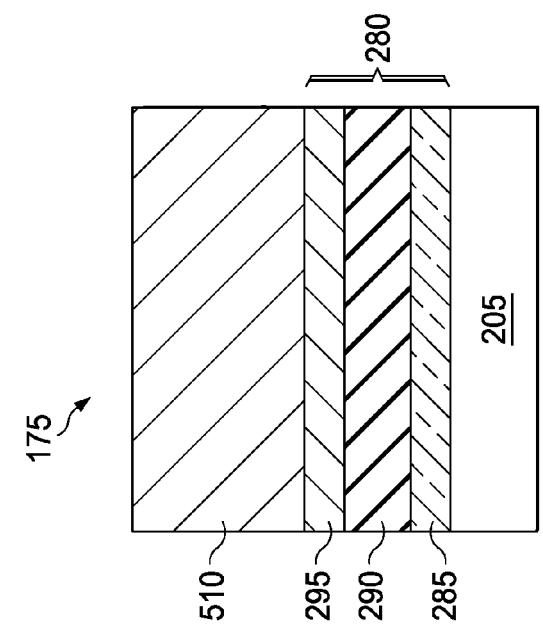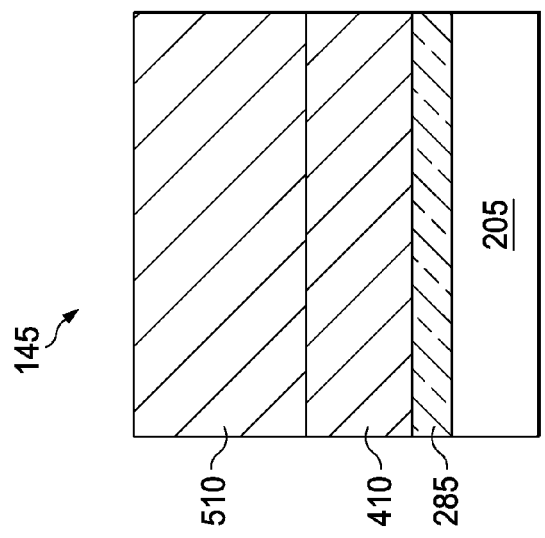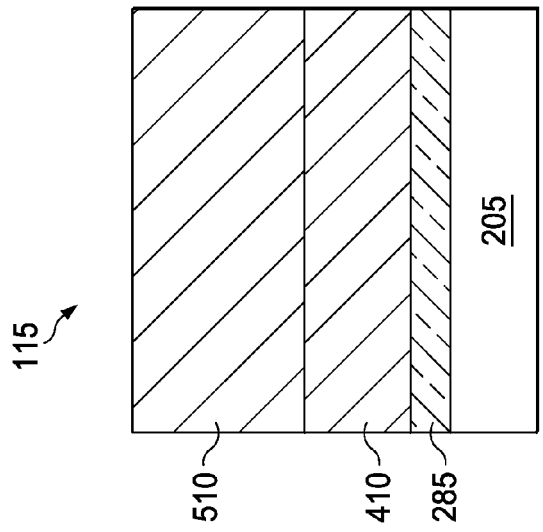

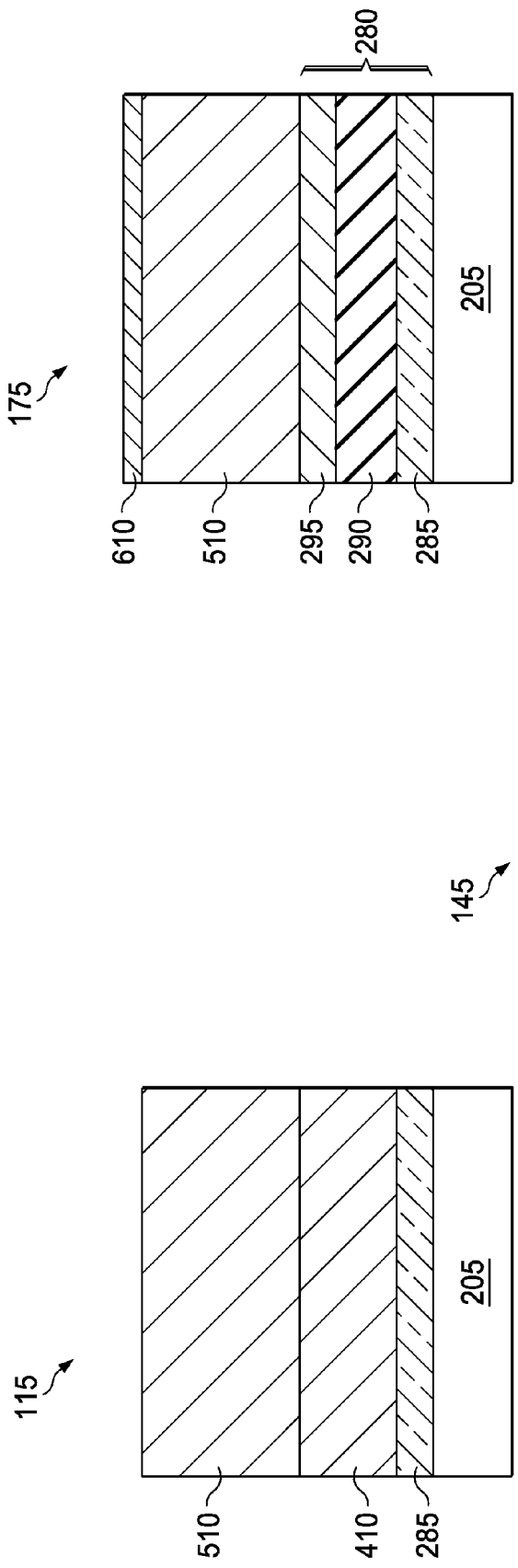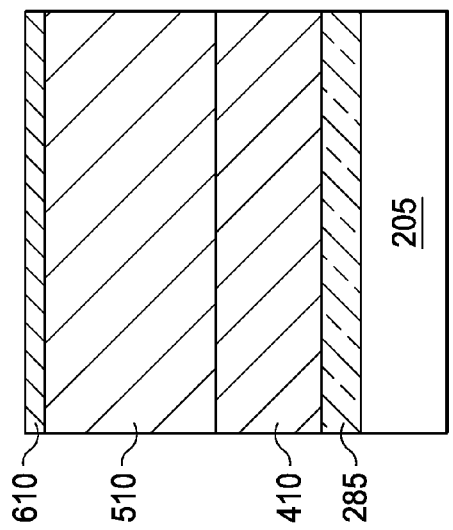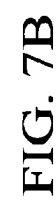

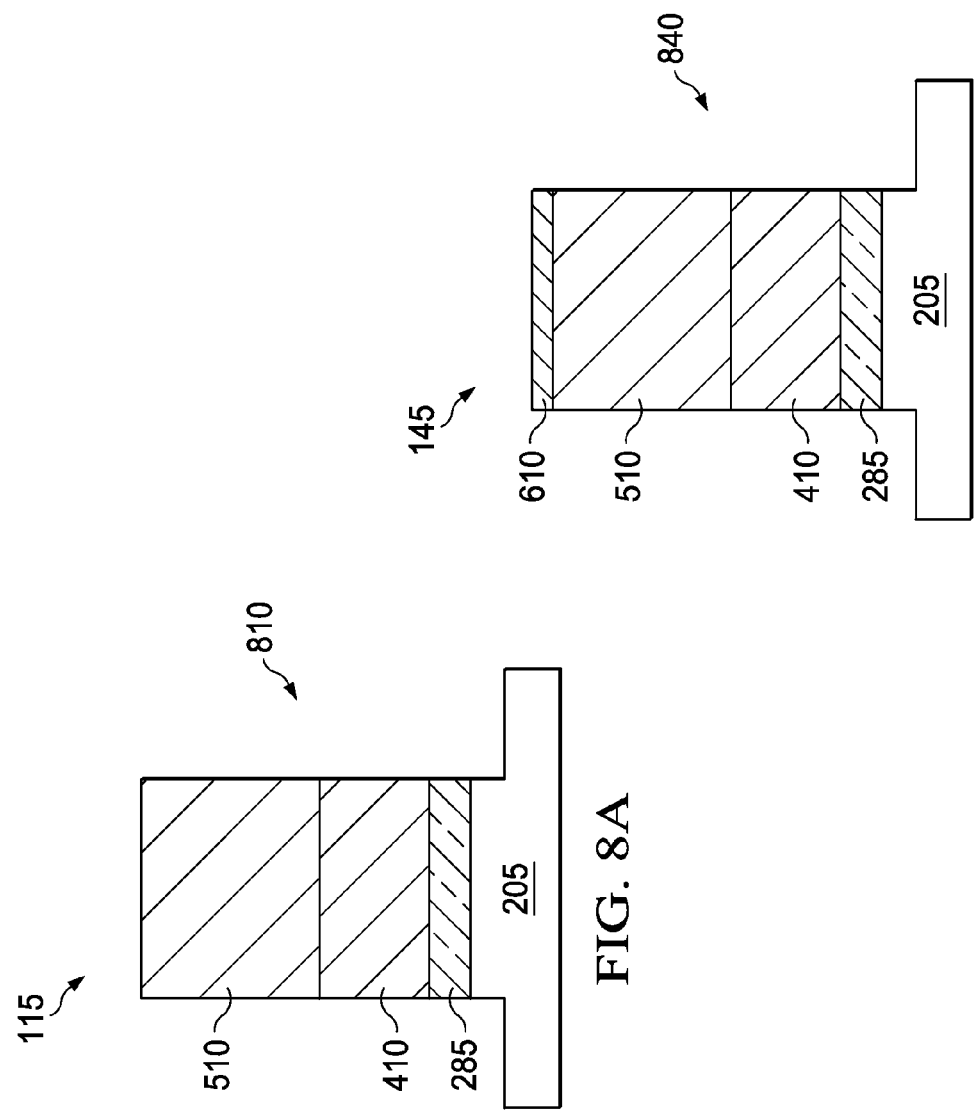

PHOTONIC INTEGRATION SCHEME

CROSS-REFERENCE TO RELATED APPLICATION

This application claims the benefit of U.S. Provisional Application Ser. No. 61/030,875, filed by Christopher Richard Doerr, et al. on Feb. 22, 2008, entitled "PHOTONIC INTEGRATION SCHEME," commonly assigned with this application and incorporated herein by reference.

TECHNICAL FIELD

The present invention is directed, in general, to a photonic integration scheme.

BACKGROUND

Recent progress in high speed, high spectral density transmission formats, such as differential quadrature phase shift key (DQPSK), requires costly sophisticated optical receivers. One way to significantly reduce the cost and size of such receivers is to use a photonic integrated circuit (PIC). In this scenario, the PIC might integrate a photodetector or semiconductor optical amplifier and one or more passive waveguides and couplers on a wafer substrate.

SUMMARY

Conventional high speed photodetectors typically employ pin photodiodes, uni-traveling carrier photodiodes, or something in between, such as a partially depleted absorber photodetector. These types of diodes require a heavily p-doped layer to achieve the high speed operation. Such heavily p-doped layers can create high loss in the passive waveguides integrated therewith. Likewise, semiconductor optical amplifiers employ a gain medium under a heavily p-doped layer. To address the above-discussed deficiencies, various embodiments provide an apparatus or a method for manufacture thereof.

In one embodiment, the method includes providing a substrate having laterally adjacent first and second lateral regions on a planar surface thereof. The method further includes forming an optical core layer on the substrate in the first and second lateral regions, and forming an absorber or gain medium layer on the optical core layer in the second lateral region. An upper optical cladding layer is formed on the optical core layer in the first lateral region and a doped semiconductor layer is formed over the upper optical cladding layer in the first lateral region and over the absorber or gain medium layer in the second lateral region. In this embodiment, the first lateral region forms a passive optical waveguide structure and the second lateral region forms a photodiode or amplifier structure, the photodiode or amplifier structure being optically connected to receive light from the passive optical waveguide structure.

In one embodiment, the apparatus includes a passive optical waveguide structure and a photodiode detector structure. The structures are located on a substrate, and the photodiode detector is laterally proximate to the semiconductor passive waveguide structure. The passive optical waveguide structure includes a first lateral portion of a semiconductor optical core layer on the substrate, a semiconductor upper optical cladding layer on the optical core layer, and a first lateral portion of a doped semiconductor layer on the upper optical cladding layer. The photodiode detector structure includes a second lateral portion of the semiconductor optical core layer, a semiconductor optical absorber layer on the optical core layer, and a second lateral portion of the doped semiconductor layer.

BRIEF DESCRIPTION OF THE DRAWINGS

For a more complete understanding of the disclosure, reference is now made to the following descriptions:

FIGS. 1A thru 1D illustrate an apparatus manufactured in accordance with one embodiment; and FIGS. 2A thru 10C illustrate various cross-sections of an apparatus, e.g., the apparatus of FIGS. 1A-1D, at different stages of an exemplary manufacture thereof.

DETAILED DESCRIPTION

The present disclosure is based, at least in part, on the recognition that high speed photodiode or amplifier structures and low loss passive waveguides can be integrated on a single planar surface of a substrate. For example, one or more extra steps may be used to reduce the dopant concentration of the upper optical cladding layer of the passive waveguide structure, while maintaining a heavier dopant concentration in the upper layer of the photodiode or amplifier. What results is significantly reduced carrier transport time in the photodetector, for example as a result of the heavy dopant concentration, as well as significantly reduced loss in the passive waveguide, for instance as a result of the lower dopant concentration proximate the optical core.

Likewise, the alloy compositions in the layers of the passive waveguides and the photodiodes or amplifiers may be tailored. For example, the alloy compositions of the layers in the passive waveguides may be tailored such that the band gap energy thereof is bigger than the energy of the wavelength of light in the telecommunications C-band, and thus said layers function as cladding layers. In contrast, the alloy compositions of the pertinent layers in the photodiode or amplifier structures may be tailored such that the band gap energy thereof is less than the energy of the wavelength of light in the telecommunications C-band, and thus said layers function as absorber layers. Given this understanding, those skilled in the art can appropriately manufacture said structures.

Figure 1A:
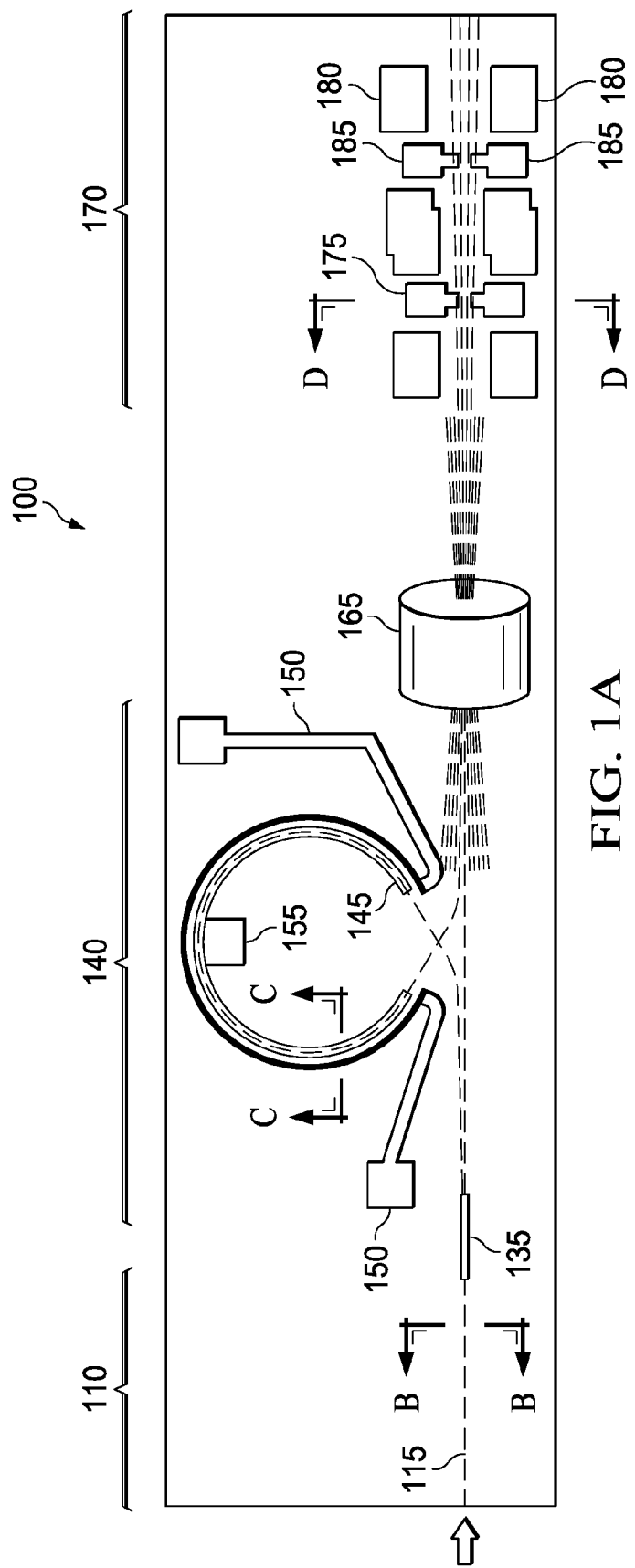

FIG. 1A illustrates a planar apparatus 100 manufactured in accordance with one embodiment. The apparatus 100 is configured as a monolithically integrated optical receiver for differential quadrature phase shift keying (DQPSK) optical data streams. Nevertheless, the apparatus 100 can be configured as a device for processing other types of optical data streams, or other uses, and remain within the purview of the disclosure.

In FIGS. 1A-1D, the planar apparatus 100 includes first and third lateral regions 110, 140 with passive optical waveguide structures and a second lateral region 170 with a photodiode or amplifier structure. In this embodiment, a 1×2 optical coupler 135 couples an optical waveguide of the first lateral region 110 to the passive optical waveguide structure of the third lateral region 140. The 1×2 optical coupler 135 may comprise many different configurations and remain within the purview of the disclosure. In one example embodiment, the 1×2 optical coupler 135 comprises a multimode interference (MMI) coupler. In yet other embodiments, the 1×2 optical coupler 135 comprises a directional optical coupler, star coupler, or y-branch optical coupler. In even other embodiments, the 1×2 optical coupler 135 is actually a 2×2 optical coupler with one of the optical inputs unused.

Additionally, in this embodiment, a 2×4 optical coupler 165 couples the passive optical waveguide structure of the third lateral region 140 to the photodiode or amplifier structure of the second lateral region 170. The 2×4 optical coupler 165 may also comprise many different configurations and remain within the purview of the disclosure. In the embodiment of FIG. 1A, however, the 2×4 optical coupler 165 comprises a 2×4 star coupler. In this example, the 2×4 star coupler functions as a 90° optical hybrid, allowing QPSK demodulation with a single delay interferometer.

The first lateral region 110 of FIG. 1A includes a first passive optical waveguide structure 115 manufactured in accordance with the disclosure. The third lateral region 140 of FIG. 1A includes a passive optical waveguide structure 145 with one or more optical phase shifting devices. For example, in the embodiment of FIG. 1A the third lateral region 140 includes one or more thermo-optic phase shifter pads 150, as well as a current-injection phase shifter pad 155. The second lateral region 170 of FIG. 1A, in contrast to the first and third lateral regions 110, 140, includes a photodiode or amplifier structure 175. The second lateral region 170 further includes a collection of contact pads 180, as well as a collection of photodiode or amplifier contact pads 185.

Turning now to FIGS. 1B thru 1D, illustrated are cross-sectional views of the passive optical waveguide structure 115 of the first lateral region 110, passive optical waveguide structure 145 of the third lateral region 140 and the photodiode or amplifier structure 175 of the second lateral region 170, wherein each element may be manufactured in accordance with methods described herein.

At this point in the disclosure, it is appropriate to define what is meant by a passive optical waveguide or a passive optical waveguide structure. The phrase "passive optical waveguide", as used throughout this disclosure, means any optical waveguide that is not configured to perform optical amplification or optical detection, e.g., it does not include photodiode, amplification or photo-transistor structures. Accordingly, any optical waveguide that is functioning as an optical amplifier or an optical detector would not be considered as part of a passive optical waveguide as defined herein. A passive optical waveguide could, in one embodiment, be a thermo-optical or electro-optical phase modulator and/or attenuator. For example, by injecting current into the passive waveguide, one could achieve a phase shift in the waveguide. Also for example, by applying a voltage across the passive waveguide, one could achieve optical attenuation and/or a phase shift.

With initial reference to FIG. 1B, the first passive optical waveguide structure 115 includes a substrate 120 having a planar top surface. The substrate 120, in the embodiment shown, is a buffer substrate comprising a silicon doped indium phosphide alloy, i.e., n-type InP. Located on the top surface of the substrate 120 is a first optical core layer 122. The first optical core layer 122, in this embodiment, is an indium gallium arsenide phosphide (InGaAsP) alloy. Positioned over the first optical core layer 122 is an upper optical cladding layer 124, in this embodiment indium phosphide (InP) alloy. The upper optical cladding layer 124 may, depending on the embodiment, be either un-doped or lightly doped (e.g., p-type). The upper optical cladding layer 124, in this embodiment, includes a first substantially undoped portion 126 and a second graded doped portion 128. In this embodiment, the first substantially undoped portion 126 is located proximate the first optical core layer 122, whereas the second graded doped portion 128 is located distal the first optical core layer 122. The second graded doped portion 128, in this embodiment, includes a p-type dopant concentration that may graduate from about $1 \times 10^{16}$ atoms/cm$^3$ up to about $5 \times 10^{17}$ atoms/cm$^3$.

Located on the upper optical cladding layer 124 in the embodiment of FIG. 1B is a doped semiconductor layer 130. The doped semiconductor layer 130, in this embodiment, comprises heavily (e.g., as compared to the upper optical cladding layer 124) p-type doped InP. For example, a dopant concentration (e.g., peak) of the doped semiconductor layer 130 may, in one embodiment, range from about $5 \times 10^{17}$ Si atoms/cm$^3$ to about $5 \times 10^{19}$ Si atoms/cm$^3$. Likewise, a dopant concentration of the doped semiconductor layer 130 may be graded to increase as it moves away from the substrate 120. In one embodiment, the dopant concentration is graded from about $1 \times 10^{18}$ atoms/cm$^3$ to about $3 \times 10^{18}$ atoms/cm$^3$. As will be more evident below, the dopant profile of the doped semiconductor layer 130 may be similar to the dopant profile of similar layers in the second passive waveguide structure 145 and the photodiode or amplifier structure 175. Located over, and in this embodiment surrounding the first passive waveguide structure 115 is a lateral optical cladding layer 132. The lateral optical cladding layer 132, in this embodiment, comprises benzocyclobutene (BCB). Nevertheless, other relatively low index materials may be used for such a lateral optical cladding layer.

With reference to FIG. 1C, the second passive optical waveguide structure 145, which allows for current injection or a voltage to be applied across the waveguide for the purpose of phase shifting and/or attenuating, includes the substrate 120. Located on the substrate 120 is a second optical core layer 152. The second optical core layer 152, in this embodiment, is an indium gallium arsenide phosphide (InGaAsP) alloy, similar to the first optical core layer 122. In many embodiments, the second optical core layer 152 and the first optical core layer 122 comprise identical materials, dopants, etc. Positioned over the second optical core layer 152 is a second upper optical cladding layer 154, in this embodiment an indium phosphide (InP) alloy. The second upper optical cladding layer 154, similar to the upper optical cladding layer 124, includes a first substantially undoped portion 156 and a second graded doped portion 158. In this embodiment, the first substantially undoped portion 156 is located proximate the second optical core layer 152, whereas the second graded doped portion 158 is located distal the second optical core layer 152. The second graded doped portion 158, in this embodiment, may include a p-type dopant concentration that graduates up to about $5 \times 10^{17}$ Si atoms/cm$^3$.

Located on the second upper optical cladding layer 154 in the embodiment of FIG. 1C is a second doped semiconductor layer 160. The second doped semiconductor layer 160, in this embodiment, comprises heavily p-type doped InP (in contrast to the lightly to undoped second upper optical cladding layer 154). For example, a dopant concentration of the second doped semiconductor layer 160 may be graded to increase as it moves away from the substrate 120. In one embodiment, the dopant concentration is graded from about $1 \times 10^{18}$ atoms/cm$^3$ to about $3 \times 10^{18}$ atoms/cm$^3$, in many embodiments being substantially similar to that of the doped semiconductor layer 130. Positioned on the second doped semiconductor layer 160 is a contact layer 162. The contact layer 162, in one embodiment, comprises heavily p-type doped InGaAs. For example, the contact layer 162 might comprise zinc doped InGaAs, wherein the zinc dopant concentration is about $2 \times 10^{19}$ atoms/cm$^3$.

Positioned over the second passive waveguide structure 145 is the lateral optical cladding layer 132. The lateral optical cladding layer 132, in accordance with this disclosure, may comprise the previously mentioned BCB. Additionally, positioned within an opening in the lateral optical cladding layer 132, and in contact with the contact layer 162, is a conducting contact 164. The conducting contact 164, in one embodiment, comprises a titanium/gold contact.

With reference to FIG. 1D, the photodiode or amplifier structure 175 includes the substrate 120. Again, the photodiode or amplifier structure 175 may comprise, either a photodiode detector structure or amplifier structure, among others. Located over the substrate 120 is a third optical core layer 182. The third optical core layer 182, in this embodiment, comprises an indium gallium arsenide phosphide (InGaAsP) alloy, similar to the first optical core layer 122 and second optical core layer 152. Again, said layers are often formed in the same processing step. Positioned on the third optical core layer 182 is an absorber or gain medium layer 184, comprising either an absorber or gain medium layer depending on the configuration of the device. The absorber or gain medium layer 184, in this embodiment, is configured as an absorber layer and comprises InGaAs. For example, the absorber or gain medium layer 184 could comprise a 350-nm p-type doped InGaAs layer. In this embodiment, the absorber or gain medium layer 184 might be p-type doped one third the way through, resulting in a partially-depleted waveguide photodiode. In this manufacturing scheme, the combination of the n-type substrate 120, third optical core layer 182, and p-type doped absorber or gain medium layer 184, form the diode of the photodiode or amplifier structure 175.

Located over the absorber or gain medium layer 184 is a third doped semiconductor layer 186. The third doped semiconductor layer 186, in this embodiment, comprises heavily p-type doped InP. For example, in one embodiment the third doped semiconductor layer 186 includes a first intermediate portion 188 and a second portion 189. In this embodiment, a dopant concentration of the first intermediate portion 188 is substantially fixed, wherein a dopant concentration of the second portion 189 is graded to increase as it moves away from the substrate 120. In one embodiment, the dopant concentration is graded from about $1 \times 10^{18}$ atoms/cm$^3$ to about $3 \times 10^{18}$ atoms/cm$^3$. Likewise, the dopant profile of the second portion 189 may be substantially similar to that of the doped layers 130 and 160.

Positioned on the third doped semiconductor layer 186 is a contact layer 190. The contact layer 190, in this embodiment, comprises heavily doped InGaAs. For example, the contact layer 190 might comprise zinc doped InGaAs, wherein the zinc dopant concentration is about $2 \times 10^{19}$ atoms/cm$^3$. Positioned laterally to the photodiode or amplifier structure 175 is the lateral optical cladding layer 132. The lateral optical cladding layer 132, in accordance with this disclosure, may comprise the previously mentioned BCB. Additionally, positioned within an opening in the lateral optical cladding layer 132, and in contact with the contact layer 190, is a conducting contact 192. The conducting contact 192, in one embodiment, comprises a titanium/gold contact.

Figure 9A:
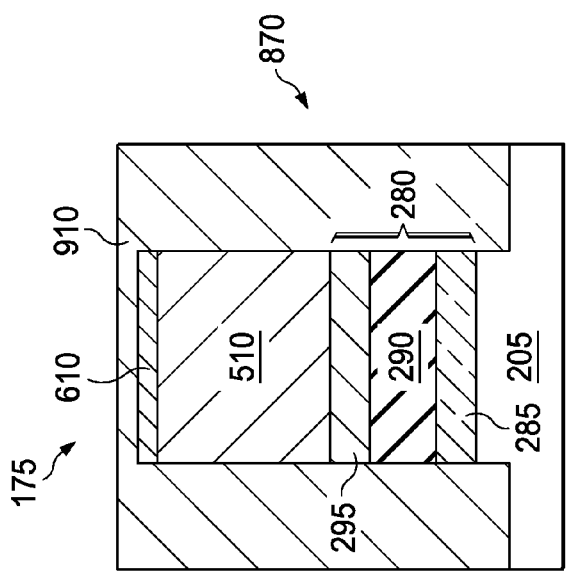
Figure 9B:
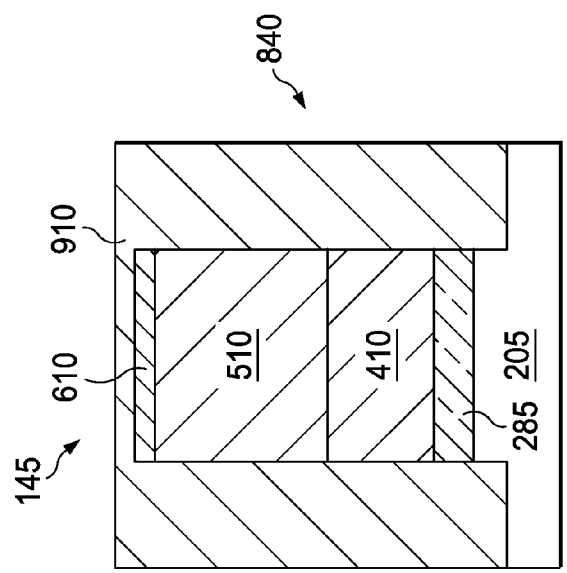
Figure 9C:
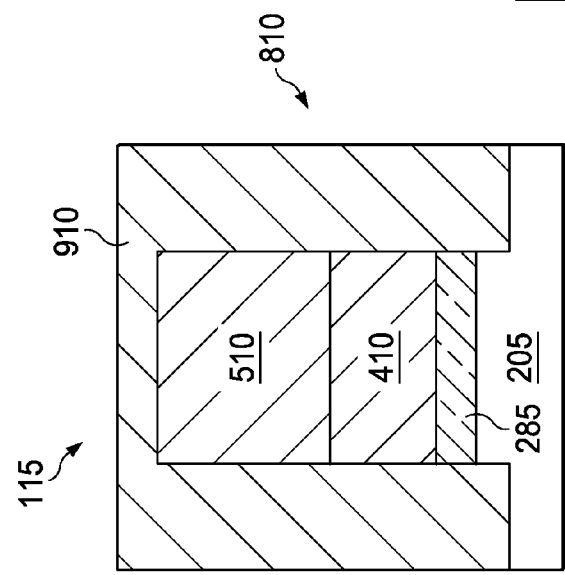
Figure 10A:
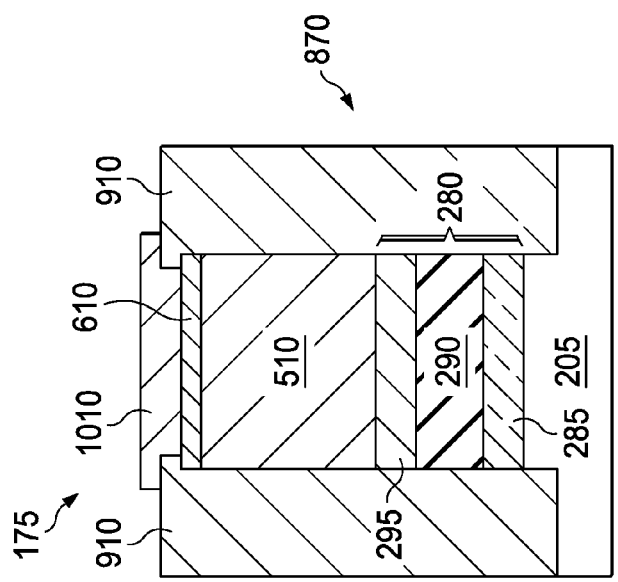
Figure 10B:
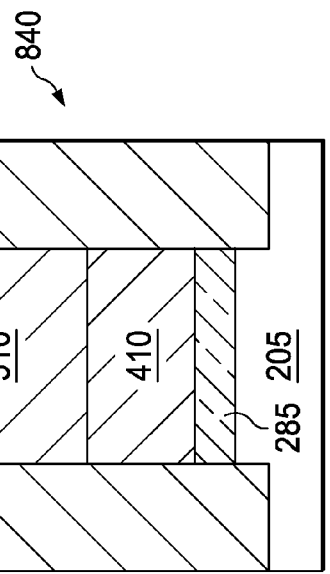
Figure 10C:
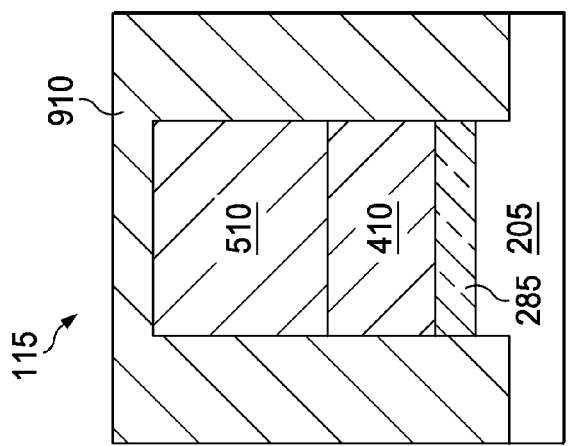

FIGS. 2A thru 9C, illustrate cross-sections of intermediate structures at various stages of manufacture for the final apparatus whose cross-sections are illustrated in FIGS. 10A-10C, e.g., the apparatus 100 of FIGS. 1A thru 1D.

FIGS. 2A thru 2C illustrate the apparatus 100 at an initial stage of manufacture. FIG. 2A illustrates initial structures for the first lateral region 115 of the apparatus 100, FIG. 2B illustrates the adjacent third lateral region 145 of the apparatus 100, and FIG. 2C illustrates the adjacent second lateral region 175 of the apparatus 100. In the illustrative embodiment of FIGS. 2A thru 2C, each of the regions 115, 145, 175 lie on a planar top surface of the substrate 205. Formed on the substrate 205 in each of the regions 115, 145, 175 are a stack of layers 280. The stack of layers 280, in this embodiment, comprises an optical core layer 285, an absorber or gain medium layer 290, and an intermediate doped semiconductor layer 295.

The substrate 205, in this embodiment, is a silicon doped InP substrate (i.e., n-type) that has been epitaxially grown from an n-type InP base substrate. For example, the substrate 205 might have a n-type dopant ranging from about $1 \times 10^{18}$ atoms/cm$^3$ to about $1 \times 10^{18}$ atoms/cm$^3$. Moreover, in the embodiment shown, the substrate 205 has a thickness of about 1.5 µm. The optical core layer 285, in this embodiment, comprises an InGaAsP layer having a band gap of approximately 1.4 µm. In this embodiment, the optical core layer 285 has a thickness of approximately 200 nm. While not shown, certain embodiments have an etch stop layer located between the optical core layer 285 and the absorber or gain medium layer 290. If used, the etch stop layer might comprise InP and have a thickness of around about 20 nm.

The absorber or gain medium layer 290, in the embodiment shown in FIGS. 2A thru 2C, may comprise InGaAs and may further have a thickness of approximately 350 nm. Likewise, the absorber or gain medium layer 290 may be p-type doped about one third the way through, to produce a partially-depleted evanescent waveguide that functions as a photodiode. For example, the absorber or gain medium layer 290 might have a p-type dopant ranging from about zero to about $1 \times 10^{18}$ atoms/cm$^3$. The intermediate doped semiconductor layer 295, in this embodiment, may comprise p-type doped InP, for example having a thickness of about 150 nm and having a dopant concentration of approximately $1 \times 10^{18}$ atoms/cm$^3$. If the absorber or gain medium layer 290 were to comprise a gain medium layer, its material composition and thickness might differ from that just listed.

FIGS. 3A thru 3C illustrate the apparatus 100 of FIGS. 2A thru 2C after patterning a masking layer 310 to expose at least a portion of the first lateral structure region 115 and the third lateral region 145 while protecting at least a portion of the second lateral region 175 for the photodiode. Thereafter, the absorber or gain medium layer 290 and the intermediate doped semiconductor layer 295 are removed or etched from the first and third lateral regions 115, 145 where passive optical waveguide structures will be formed. The total thickness of the removed layers may be less than about 500 nm. Keeping this layer relatively thin allows the next growth to also be thin, mitigating the enhanced growth at the boundary of the masked and non-masked regions. This enhanced growth creates peaks, often called "rabbit ears", making further processing difficult. One embodiment only requires a shallow growth at this stage, thus resulting in small rabbit ears, at most.

FIGS. 4A thru 4C illustrate the apparatus 100 of FIGS. 3A thru 3C after forming an upper optical cladding layer 410 on the optical core layer 285 in the first and third lateral regions 115, 145. The upper optical cladding layer 410, in this embodiment, includes a first substantially undoped portion 420 and a second graded portion 430. The upper optical cladding layer 410 may have a total thickness of around about 500 nm, with the first undoped portion 420 comprising about 250 nm and the second graded portion 430 comprising the other 250 nm. The second graded portion 430 may have a graduated p-type doping to about $5 \times 10^{17}$ atoms/cm$^3$. The second graded portion 430, in one embodiment, is configured to help assure that a p-n junction can inject current for fine phase tuning of the waveguide. If said tuning is unnecessary, one can reduce the doping of the second graded portion 430 to further reduce optical loss in the waveguide due to p doping.

FIGS. 5A thru 5C illustrate the apparatus 100 of FIGS. 4A thru 4C after forming a doped semiconductor layer 510 over the first, third, and second lateral regions 115, 145, 175, respectively. The doped semiconductor layer 510, in this embodiment, is a heavily p-type doped layer (e.g., as compared to the upper optical cladding layer 410) and may include a graduated doping from about $1\times10^{18}$ atoms/cm$^3$ to about $3\times10^{18}$ atoms/cm$^3$. Likewise, in one embodiment, the doped semiconductor layer 510 may have a thickness of around about 1.5 μm.

Figure 6A:
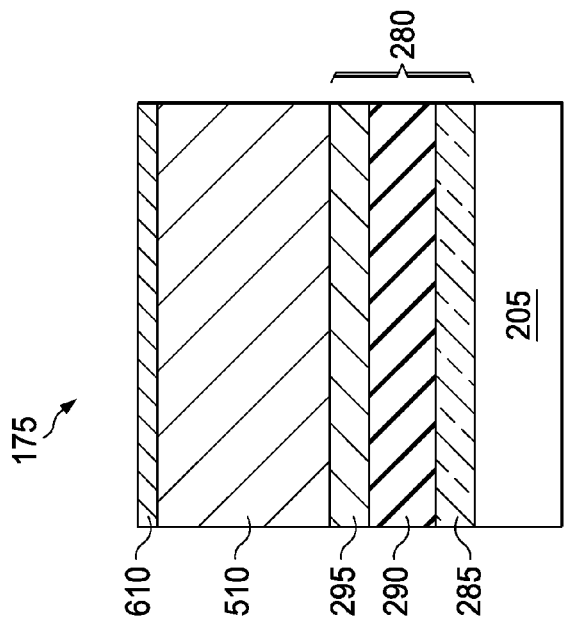
Figure 6B:
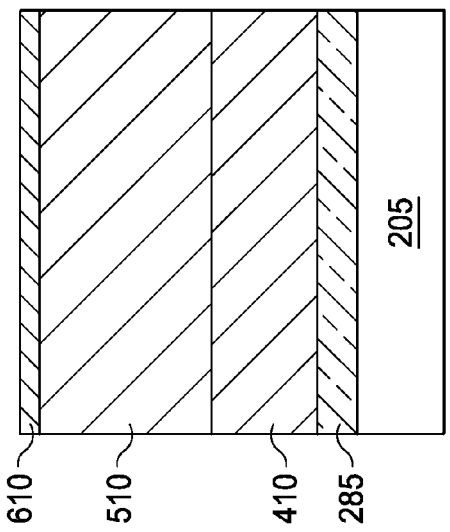
Figure 6C:
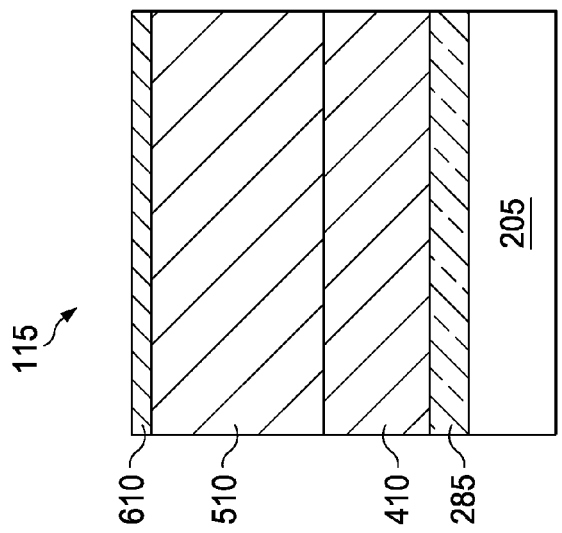

FIGS. 6A thru 6C illustrate the apparatus 100 of FIGS. 5A thru 5C after forming a contact layer 610 over portions of the first, third, and second lateral regions 115, 145, 175, respectively. The contact layer 610, in one embodiment, comprises a heavily p-type doped InGaAs layer. For example, the contact layer 610 can include a zinc dopant concentration of about $2\times10^{19}$ atoms/cm$^3$, as well as a thickness or about 100 nm, and remain within the purview of the disclosure.

FIGS. 7A thru 7C illustrate the apparatus 100 of FIGS. 6A thru 6C after removing the contact layer 610 from over the first lateral region 115. Those skilled in the art understand the process required to remove the contact layer 610 from over the first lateral region 115, including in one embodiment patterning photoresist to expose the contact layer 610 in the first lateral region 115, and using an etch for removal of the exposed portion of the contact layer 610.

FIGS. 8A thru 8C illustrate the apparatus 100 of FIGS. 7A thru 7C after patterning the first, third, and second lateral regions 115, 145, 175, into a first passive optical waveguide structure 810, a second passive optical waveguide structure 840, and a photodiode or amplifier structure 870, respectively. As is illustrated, the first passive optical waveguide structure 810, the second passive optical waveguide structure 840, and the photodiode or amplifier structure 870 may comprise ridge structures. In one embodiment, the apparatus 100 of FIGS. 7A thru 7C is etched about 2.35 μm, resulting in the first passive optical waveguide structure 810, the second passive optical waveguide structure 840, and the photodiode or amplifier structure 870. The first passive optical waveguide structure 810, in this embodiment, comprises the optical core layer 285, the upper optical cladding layer 410 and the doped semiconductor layer 510. The second passive optical waveguide structure 840, in this embodiment, comprises the optical core layer 285, the upper optical cladding layer 410, the doped semiconductor layer 510, and the contact layer 610. The photodiode or amplifier structure 870, in this embodiment, includes the optical core layer 285, the absorber or gain medium layer 290, the intermediate doped semiconductor layer 295, the doped semiconductor layer 510, and the contact layer 610.

FIGS. 9A thru 9C illustrate the apparatus 100 of FIGS. 8A thru 8C after forming a top and lateral optical cladding layer 910 surrounding the first passive optical waveguide structure 810, the second passive optical waveguide structure 840, and the photodiode or amplifier structure 870. The top and lateral optical cladding layer 910, in one embodiment, comprises the previously mentioned BCB. As illustrated, the thickness of the top and lateral optical cladding layer 910 should be sufficient to surround the first passive optical waveguide structure 810, the second optical passive waveguide structure 840, and the photodiode or amplifier structure 870.

FIGS. 10A thru 10C illustrate the apparatus 100 of FIGS. 9A thru 9C after forming an opening in the top and lateral optical cladding layer 910 to expose the contact layer 610 in lateral portions of each of the third lateral region 145 and the second lateral region 175. Formed within the openings in the third and second lateral regions 145, 175, and contacting the contact layers 610, are conducting contacts 1010. The conducting contacts 1010, in this embodiment, may comprise titanium, platinum, gold, and other metals, and may have a thickness of about 1 μm.

Although the present disclosure has been described in detail, those skilled in the pertinent art should understand that they can make various changes, substitutions and alterations herein without departing from the spirit and scope of the disclosure.

What is claimed is:

1. A method for manufacturing an apparatus, comprising:
providing a substrate having laterally adjacent first and second lateral regions on a planar surface thereof;
forming an optical core layer on the substrate in the first and second lateral regions;
forming an absorber or gain medium layer over the optical core layer in the second lateral region;
forming an upper optical cladding layer on the optical core layer in the first lateral region;
forming a doped semiconductor layer over the upper optical cladding layer in the first lateral region and over the absorber or gain medium layer in the second lateral region; and
wherein the first lateral region forms a passive optical waveguide structure and the second lateral region forms a photodiode or amplifier structure, the photodiode or amplifier structure being optically connected to receive light from the passive optical waveguide structure.

2. The method of claim 1 wherein the absorber or gain medium layer has a total thickness of less than about 500 nm.

3. The method of claim 1 wherein a dopant concentration of the doped semiconductor layer is graded from about $1\times10^{18}$ atoms/cm$^3$ to about $3\times10^{18}$ atoms/cm$^3$ as it moves away from the substrate.

4. The method of claim 1 further including:
forming a conducting contact layer on the doped semiconductor layer in the second lateral region;
laterally patterning the second lateral region into the photodiode or amplifier structure including a semiconductor stack formed of portions of the optical core layer, the absorber or gain medium layer, the doped semiconductor layer, and the contact layer; and
laterally patterning the first lateral region into the passive optical waveguide structure including a semiconductor stack formed by portions of the optical core layer, the upper optical cladding layer and the doped semiconductor layer.

5. The method of claim 4 further including, forming a lateral optical cladding layer surrounding the photodiode or amplifier structure and the passive optical waveguide structure such that an opening in the lateral optical cladding layer exposes part of the contact layer in the photodiode or amplifier structure.

6. The method of claim 1 wherein the steps of forming an optical core layer, forming an absorber or gain medium layer, forming an upper optical cladding layer, and forming a doped semiconductor layer, include forming a stack of layers including the optical core layer and the absorber or gain medium layer over the first and second lateral regions, removing the absorber or gain medium layer from the first lateral region to expose the optical core layer in the first lateral region, forming the upper optical cladding layer on the exposed optical core layer in the first lateral region, and forming the doped semiconductor layer over the upper optical cladding layer in the first lateral region and over the absorber or gain medium layer in the second lateral region.

7. The method of claim 1 wherein the upper optical cladding layer has a first substantially undoped semiconductor portion proximate the optical core layer and a second graded doped semiconductor portion distal the optical core layer.

8. The method of claim 1 wherein a dopant concentration of the upper optical cladding layer increases as it moves away from the optical core layer.

9. The method of claim 1 wherein the upper optical cladding layer has a dopant concentration of less than about $5 \times 10^{17}$ atoms/cm$^3$ and the doped layer has a dopant concentration between about $5 \times 10^{17}$ atoms/cm$^3$ and about $5 \times 10^{19}$ atoms/cm$^3$.

10. The method of claim 1 wherein the photodiode or amplifier structure is a photodiode detector structure and the absorber or gain medium layer is an absorber layer.

11. An apparatus, comprising:
a semiconductor passive optical waveguide structure being located over a substrate and including:
a first lateral portion of an optical core layer located on the substrate,
an upper optical cladding layer located on the first lateral portion of the optical core layer, and
a first lateral portion of a doped semiconductor layer located on the upper optical cladding layer; and
a photodiode or amplifier structure being located on the substrate laterally proximate the semiconductor passive optical waveguide structure and including:
a second lateral portion of the optical core layer located on the substrate;
an absorber or gain medium layer located over the second lateral portion of the optical core layer; and
a second lateral portion of the doped semiconductor layer located over the absorber or gain medium layer.

12. The apparatus of claim 11 wherein the photodiode or amplifier detector structure further includes an intermediate doped semiconductor layer located between the second lateral portion of the doped semiconductor layer and the absorber or gain medium layer, and further wherein a dopant concentration of the intermediate doped semiconductor layer is substantially fixed and a dopant concentration of the doped semiconductor layer is graded to increase as it moves away from the substrate.

13. The apparatus of claim 11 wherein the doped semiconductor layer has a dopant concentration that monotonically grows with distance from the substrate.

14. The apparatus of claim 11 wherein the upper optical cladding layer has a first substantially undoped portion proximate the optical core layer and a second graded doped portion distal the optical core layer.

15. The apparatus of claim 14 wherein a dopant concentration of the second graded doped portion increases with distance from the substrate.

16. The apparatus of claim 11 wherein the substrate includes a silicon doped indium phosphide buffer layer, the optical core layer includes indium gallium arsenide phosphide, the optical absorber or gain medium layer includes p-type doped indium gallium arsenide, the upper optical cladding layer includes p-type doped indium phosphide, and the doped semiconductor layer includes p-type doped indium phosphide.

17. The apparatus of claim 11 wherein the passive optical waveguide structure is a first passive optical waveguide structure, and further including a second passive optical waveguide structure located over the substrate proximate the first passive optical waveguide structure and the photodiode or amplifier structure, wherein the second passive optical waveguide structure includes a controllable optical phase shifter.

18. The apparatus of claim 17 wherein the apparatus forms at least a portion of a monolithically integrated differential quadrature phase shift keying (DQPSK) receiver.

19. The apparatus of claim 11 wherein the passive optical waveguide structure and the photodiode or amplifier structure are ridge structures.

20. The apparatus of claim 11 wherein the photodiode or amplifier structure is a photodiode detector structure and the absorber or gain medium layer is an absorber layer.

21. The apparatus of claim 11 wherein the photodiode or amplifier structure is an amplifier structure and the absorber or gain medium layer is a gain medium layer.

* * * * *